United States Patent [19]
Kondo

[11] Patent Number: 6,101,621
[45] Date of Patent: Aug. 8, 2000

[54] LOGIC CIRCUIT AND METHOD FOR DESIGNING THE SAME

[75] Inventor: Yoshihisa Kondo, Kanagawa, Japan

[73] Assignee: Kabushiki Kaisha Toshiba, Tokyo, Japan

[21] Appl. No.: 08/733,074

[22] Filed: Oct. 16, 1996

[30] Foreign Application Priority Data

Oct. 20, 1995 [JP] Japan .................................. 7-272892
Jun. 14, 1996 [JP] Japan .................................. 8-154384

[51] Int. Cl.[7] .............................. G06F 11/00; G06F 7/52
[52] U.S. Cl. ...................................... 714/724; 395/500.02
[58] Field of Search ............................ 371/22.1, 25.1, 371/27.5, 28; 364/761, 748, 754, 768, 606; 395/800, 396, 500.01, 500.02, 500.03, 500.05; 714/724, 733, 742, 9, 30

[56] References Cited

U.S. PATENT DOCUMENTS

| | | | |
|---|---|---|---|
| 4,620,292 | 10/1986 | Hagiwara et al. | 364/748 |
| 4,849,921 | 7/1989 | Yasumoto et al. | 364/715.01 |
| 4,992,969 | 2/1991 | Yamahata | 364/761 |
| 4,994,996 | 2/1991 | Fossum et al. | 364/748 |
| 5,053,987 | 10/1991 | Genusov et al. | 364/736 |
| 5,107,453 | 4/1992 | Nomura | 364/764 |
| 5,111,421 | 5/1992 | Molnar et al. | 364/748 |
| 5,126,963 | 6/1992 | Fukasawa | 364/748 |
| 5,142,685 | 8/1992 | Furui et al. | 395/800 |
| 5,377,135 | 12/1994 | Kuroiwa | 364/767 |
| 5,548,544 | 8/1996 | Matheny et al. | 364/745 |
| 5,568,412 | 10/1996 | Han et al. | 364/748 |
| 5,694,350 | 12/1997 | Wolrich et al. | 364/788 |
| 5,752,061 | 5/1998 | Michiue | 395/800 |
| 5,784,307 | 7/1998 | Sheaffer | 364/766 |
| 5,818,745 | 10/1998 | Sheaffer | 364/767 |

FOREIGN PATENT DOCUMENTS

| | | |
|---|---|---|
| 0 136 939 | 4/1985 | European Pat. Off. . |
| 0 472 148 | 2/1992 | European Pat. Off. . |
| 89 09441 | 10/1989 | WIPO . |

OTHER PUBLICATIONS

I. Unwala et al., "Superpipelined Adder Designs", IEEE Proceedings of the International Symposium on Circuits and Systems, (1993), pp. 1841–1844.

*Primary Examiner*—Robert W. Beausoliel, Jr.
*Assistant Examiner*—Nadeem Iqbal
*Attorney, Agent, or Firm*—Foley & Lardner

[57] ABSTRACT

A logic circuit with a pipelined structure has a plurality stage of combinational circuits and memory circuits such as flip-flops connected among the pipeline combinational circuits. The pipeline combinational circuits constituting a logic circuit is operated at a cycle time shorter than a signal propagation time for the critical path of the pipeline combinational circuit. For the case of activation of the path not covered by this cycle time, another combinational circuit and its peripheral circuits are additionally provided for generating a correction signal. Another combinational circuit has substantially the same logic. The cycle time is determined so as to cover the critical path including another combinational circuit. A comparator circuit compares an output signal of another combinational circuit and an output signal of the combinational circuit. If both the signals are not coincident, a selector is controlled to correct the signal by using the output signal of another combinational circuit.

14 Claims, 15 Drawing Sheets

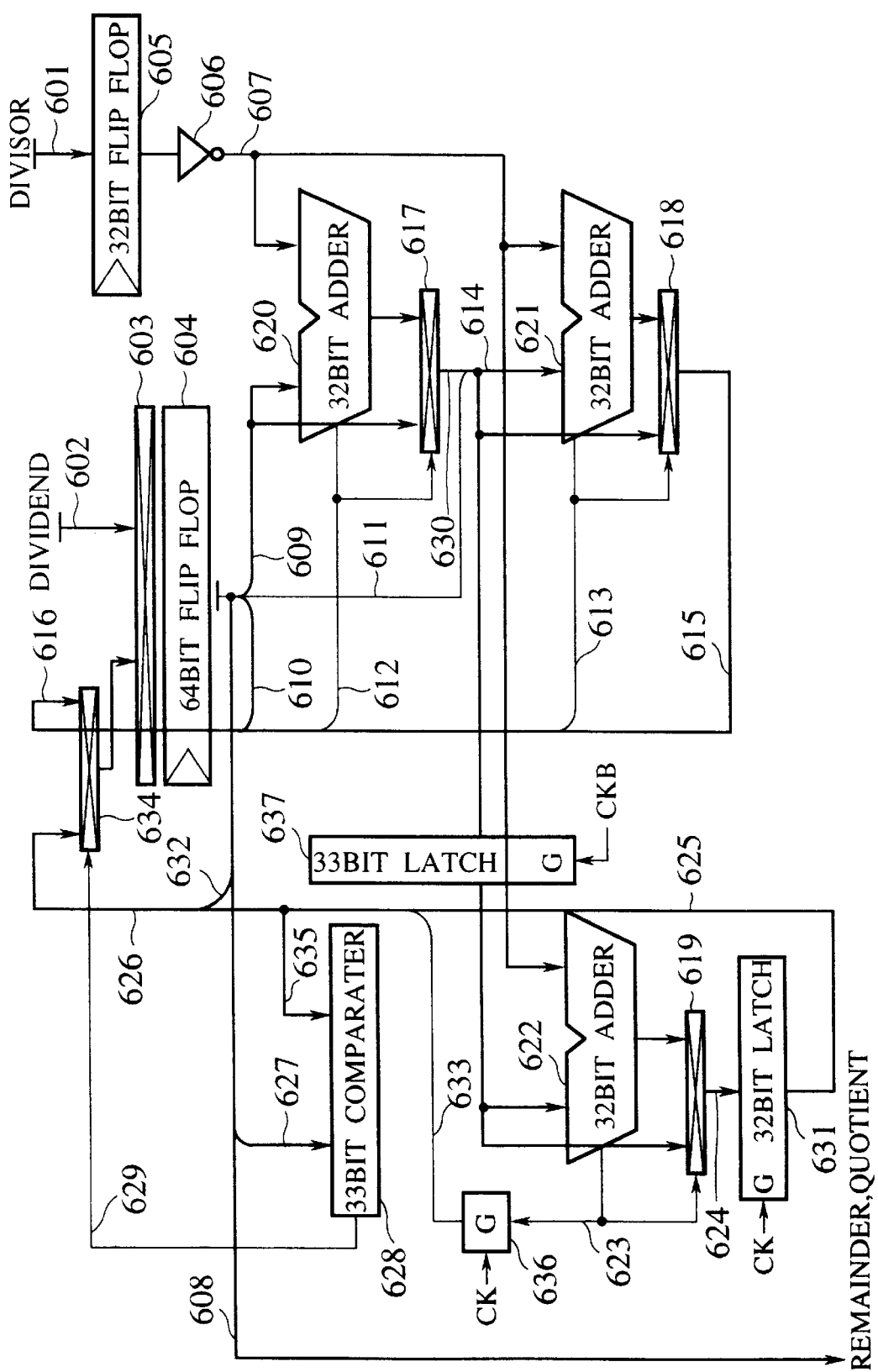

6,101,621

LOGIC CIRCUIT AND METHOD FOR DESIGNING THE SAME

BACKGROUND OF THE INVENTION

1. Field of the Invention

The present invention generally relates to a logic circuit and its design method. The invention particularly relates to a logic circuit with a pipelined structure and its design method, capable of shortening a cycle time of an operation clock of logic LSI's such as microprocessors and DSP's (digital signal processors) and improving a processing speed of the logic circuit.

2. Description of the Related Art

A logic circuit is mainly divided into a combinational circuit in which a change in an input signal propagates toward the output and influences an output signal value and a sequential circuit or a memory circuit with a function of holding a value or changing a held value in response to a control signal such as a clock signal. The combinational circuit includes fundamental logic elements (e.g., AND gates and NOT gates) having a function of arithmetic operation. The memory circuit may be a flip-flop, a latch, or the like.

In order to obtain a high performance of logic LSI's such as microprocessors and DSP's, in addition to parallel processing, the shortening of an operation cycle is carried out. In order to shorten the operation cycle of a logic LSI, it is essential to shorten the operation cycle of a logic circuit which is a main constituent of the logic LSI. The operation cycle of a logic circuit has been conventionally shortened by development of semiconductor device technology and by utilizing the leading edge circuit technology such as dynamic circuits.

In order to meet the market needs, high speed processing is required. To this end, recently, logic circuits are pipelined to shorten the operation cycle.

FIG. 1 shows a general logic circuit having a simple pipelined structure. This logic circuit has a combinational circuit 803 as a pipeline arithmetic circuit (first stage) and flip-flops 804 and 805 respectively connected to the input and output sides of the combinational circuit 803 for holding-signals. At the rising edge of a clock signal CK, the flip-flops 804 and 805 respectively input (sample) an input signal 801 and an output signal 807 from the combinational circuit 803, the held signals being output to the combinational circuit 803 and the next stage combinational circuit (second stage) 813 as signals 806 and 802, respectively. The clock signal CK periodically changes its value at a preset cycle time. A general logic circuit operates synchronously with this clock. FIG. 2 shows a clock signal waveform input to a logic circuit such as shown in FIG. 1. A cycle time of a logic circuit using a flip-flop operating in response to the rising edge of an input clock is illustrated in FIG. 2.

A time required for a change in an input signal to the combinational circuit to reach an output signal is called a signal propagation delay or a signal propagation time. This signal propagation time changes greatly depending on the circuit conditions and the way an input signal changes. A signal path with a longest signal propagation time is called a critical path of the circuit. In order to guarantee a circuit normal operation, the cycle time of a logic circuit is required to be set longer than the signal propagation time of the critical path of the circuit. This signal propagation time of the critical path sometimes contains a signal propagation time of a memory circuit such as a latch, depending upon circuit design.

Conventional design of a logic circuit has tried to shorten the signal propagation time of the critical path of the circuit in order to shorten the cycle time.

However, there is a limit in merely shortening the cycle time of the operation clock by shortening the signal propagation time of the critical path of a logic circuit. New technology for realizing a faster logic circuit has therefore been desired.

As above, if the logic circuit is pipelined, the arithmetic operation cycle can be shortened and the throughput of arithmetic operation is improved. However, a time from an arithmetic operation start to when the arithmetic results can be used, i.e., so-called latency, becomes large. In general processes, there are a number of processes which use the arithmetic results of the preceding stage arithmetic operation. Therefore, even if the logic circuit is pipelined and the operation cycle is shortened, these effects are not satisfactory from the viewpoint of performance.

SUMMARY OF THE INVENTION

The present invention has been made under the above circumstances. An object of the invention is to provide a logic circuit and its design method capable of shortening a cycle time of an operation clock of the logic circuit and improving a processing speed of the logic circuit.

Another object of the present invention is to provide a logic circuit with a pipelined structure having a short operation cycle and a short averaged latency of arithmetic operations.

In order to achieve the above objects, the inventor of this invention has considered that there is a limit in merely shortening the cycle time of the operation clock by shortening the signal propagation time of the critical path of a logic circuit and new technology is needed.

It has been found from statistical analysis of processes executed by general logic circuits that the critical path is rarely used (activated) and most frequently used paths are very short as compared to the critical path. Therefore, without using the scheme of merely shortening the cycle time of the operation clock by shortening the signal propagation time of the critical path of a logic circuit, a predetermined clock cycle shorter than the signal propagation time for the critical path is used and for the case that a path longer than the path corresponding to this shorter clock cycle is activated, some countermeasures are prepared. The inventor has considered that with this approach, the processing speed of the logic circuit can be improved greatly and the above problems can be solved.

Hence, the following inventions have been made from elaborate studies of the present inventor. Specifically, according to a first aspect of the present invention, a logic circuit is provided which has a pipelined structure including, as illustratively shown in FIGS. 3, 6, and 8, combinational circuits (103, 104; 403, 404) and memory circuits such as flip-flops (106, 107; 406, 407) for holding or changing a signal in response to a clock, the logic circuit further comprising: signal generator means (105, 405) connected to the combinational circuit for inputting a signal to be input to the combinational circuit or a signal to be generated and used in the combinational circuit, the signal generator generating, for a predetermined input signal, the same logic output signal of the combinational circuit; output signal decision means (113, 413) for judging whether an output signal of the combinational circuit is correct; and correcting means (112, 412) for outputting the output signal itself of the combinational circuit if the output signal decision means judges that the output signal of the combinational circuit is correct, and correcting the output signal of the combinational circuit by using the output signal of the signal generator means if the output signal decision means judges that the output signal of the combinational circuit is not correct.

With the logic circuit having the structure illustratively shown in FIGS. 3, 6, and 8, the main combinational circuit (103, 104; 403, 404) can be operated at a cycle time shorter than the signal propagation time of the critical path of the combinational circuit. For the activated path not covered by the cycle time, another combinational circuit (105; 405) serving as the signal generator means or means for generating the signal to have the same function as the main combinational circuit is additionally provided. It is judged whether a path not covered by the cycle time is activated. If activated, the correction signal generating means outputs the correct signal from the signal generator means (105; 405). Preferably, the main combinational circuit (103, 104; 403, 404) samples part or the whole of output signals before a signal propagation time of the critical path in the combinational circuit. Preferably, as shown in FIG. 4B, the main combinational circuit (103, 104; 403, 404) is configured to have a path length distribution that a use frequency (or the probability of the occurrence) of activated paths having shorter signal propagation times, i.e., the paths having predetermined lengths or shorter in the main combinational circuit B1 (104, 404) is higher than the use frequency (execution probability) of activated paths having the predetermined lengths or shorter in the signal generator means (combinational circuit) B2 (105, 405). If the use frequency of the activated path having a shorter signal propagation time within the cycle time in the main combinational circuit (103, 104; 403, 404) is higher than the use frequency of output signals from the signal generator means as shown in FIG. 4B, a probability of executing a penalty process (a process to be executed when the output of the main combinational circuit (103, 104; 403, 404) is not correct) is reduced. Therefore, an operation speed of the logic circuit can be improved. It is preferable as shown in FIG. 4B that the critical path length of the signal generator means (combinational circuit) B2 is shorter than that of the main combinational circuit B1 (104, 404) even though the peak of the probability distribution is positioned in longer path.

The second aspect of the invention pertains to an integer divider illustratively shown in FIG. 9. According to the second aspect of the invention, a logic circuit for performing a restoring-division is provided which has first holding means 604 for holding at least a dividend, a first subtractor 620 for inputting the dividend and a divisor held by the first holding means 604 and executing subtraction of the input data, first selection means 617 for inputting the subtraction results by the first subtractor 620 and the dividend and selecting and outputting the input data in accordance with a first selection signal, a second subtractor 621 for inputting an output of the first selection means 617 and the dividend and executing subtraction of the input data, second selection means 618 for inputting outputs of the second subtractor 612 and the first selection means 617 and selecting and outputting the input data in accordance with a second selection signal, and third selection means 603 for inputting at least an output of the second selection means 618 and the dividend and selecting the input data in accordance with a third selection signal and outputting the selected input data to the first holding means. Further, the logic circuit comprising as shown in FIG. 9: second holding means 637 for holding an output of the first selection means 617; a third subtractor 622 for inputting an output of the first selection means held by the second holding means 637 and the dividend and executing subtraction of the input data; fourth selection means 619 for inputting outputs of the third subtractor 622 and the second holding means 637 and selecting and outputting the input data in accordance with a fourth selection signal; third holding means 631 operating on a first clock for holding output data of the fourth selection means 619; fifth selection means 634 for inputting data held by the third holding means 631 and data output from the second selection means 618 and selecting the input data in accordance with a fifth selection signal and outputting the selected data to the third selection means; and comparator means 628 for inputting data held by the third holding means 631 and data held by the first holding means 604 and executing comparison between the input data and outputting the fifth selection signal.

Preferably, the second subtractor 621 is a subtractor with a ripple-carry adder, and the third subtractor is a subtractor with a carry-save adder. With this carry-save adder, the carry signal at the most significant bit (MSB) position generally forms a critical path whose signal propagation time is shorter than that of the ripple-carry adder, and other outputs than MSB position have a relatively longer signal propagation time than the ripple-carry adder. Therefore, according to the second aspect of the invention, the second subtractor 621 shown in FIG. 9 is provided with a ripple-carry adder which has generally a long critical path but relatively short signal propagation times for other signals. Therefore, even if the clock cycle time for the operation of the second subtractor 621 is made short, a probability of a penalty process can be reduced. Furthermore, the third subtractor 622 is provided with a carry save adder which has generally a short critical path but longer signal propagation times for other signals than the second subtractor 621. Therefore, even if there is a penalty process, the cycle time can be shortened.

According to the second aspect of the invention, as will be understood from the above description, the division speed of the logic circuit can be improved considerably without using a scheme of merely shortening the cycle time of the operation clock by shortening the signal propagation time of the critical path of a logic circuit.

According to a third aspect of the invention, a logic circuit having a pipelined structure is provided which includes, as illustratively shown in FIG. 11A, at least two combinational circuits 100 performing each stage calculation and at least one flip-flop 200 for holding arithmetic results of the one combinational circuit and outputting the results to the next state combinational circuit which performs calculation through pipeline processing by using the arithmetic results held by the flip-flop 200. And the logic circuit of FIG. 11A further comprising: a high-speed arithmetic results generator (300) for receiving high-speed intermediate arithmetic results of a combinational circuit during calculation among the plurality of combinational circuits, and generating and outputting high-speed arithmetic results; and a decision circuit 400 for judging from the type of calculation or operand data to be processed by the combinational circuit during calculation whether the high-speed arithmetic results are valid, and outputting a decision signal.

The logic circuit of this invention is basically pipelined and its operation cycle is shortened. For certain operand data, intermediate arithmetic results are output at the earlier pipeline stage. Therefore, for such operand data, the arithmetic results can be output with small latency.

According to a fourth aspect of the invention, a logic circuit is comprising a pipeline combinational circuit 100 as illustratively shown in FIG. 12A. The pipeline combinational circuit 100 having a plurality of sections (110a, 110b, 110c, 110d, ... ), each section is arranged at bit positions of data to be calculated by the pipeline combinational circuit 100. And the arithmetic results with and without a carry input are generated at each section, and a carry-select addition is performed for selecting the arithmetic results in accordance with a carry signal from the lower section, and final addition/subtraction results are generated through pipeline processing. Further, the logic circuit of FIG. 12A comprising: a high-speed arithmetic results generator 300 constituted by a group of selectors (310a, 310b, 310c, 310d, ... ), each selector being provided for each section (110a, 110b, 110c, 110d) in the pipeline combinational circuit 100, the selector inputting the arithmetic results with and without the carry input generated at each section and selecting the arithmetic results in accordance with the lower section carry signal, wherein the arithmetic results selected by the selector are output as intermediate addition/subtraction results 9.

Generally, the operation time of addition/subtraction largely depends upon operand data. Although depending upon the circuit configuration, the operation time is generally long as the carry propagation delay during addition/subtraction is long. The arithmetic results for operand data with short carry propagation delay can be generated in a short time. Therefore, for such operand data, the operation cycle of the whole circuit is not affected and the arithmetic results can be output at an earlier pipeline stage. It is known that most of addition/subtraction calculations have short carry propagation delay during the calculations. For example, in the case of addition/subtraction of 32-bit length, 90% or more of calculations has carry propagation of 8 bits or smaller. Therefore, the arithmetic circuit of this invention has a short operation cycle and the arithmetic results can be output with small latency in most cases. High speed calculation for a certain type of operand is also applied to other calculations such as comparison and shift calculations to which the invention is also applicable.

A fifth aspect of the invention pertains to a method for designing a logic circuit having a combinational circuit for inputting a signal in response to a predetermined clock and outputting a predetermined signal and a memory circuit in response to a predetermined clock signal and a memory circuit for holding an input signal or changing a held signal, the method comprising the steps of: setting a predetermined clock cycle shorter than a signal propagation time of a critical path of the combinational circuit; and determining a circuit for correcting an output signal if a path not covered by the predetermined clock cycle is activated.

According to a sixth aspect of the present invention, a method for designing a logic circuit is provided which has a combinational circuit for inputting a signal in response to a predetermined clock and outputting a predetermined signal and a memory circuit in response to a predetermined clock signal and a memory circuit for holding an input signal or changing a held signal, the method comprising the steps of: specifying a critical path of the combinational circuit; determining a clock for operating the combinational circuit, the clock having a cycle time shorter than a signal propagation time of the critical path; determining signal generator means coupled to the combinational circuit for generating the same logic output signal as the combinational circuit; determining output signal decision means for judging whether an output signal of the combinational circuit is correct; and determining selection means for selecting and outputting an output signal of the combinational circuit if the output signal decision means judges that an output signal of the combinational circuit is correct, and selecting and outputting an output signal of the signal generator means if the output signal decision means judges that an output signal of the combinational circuit is not correct, so that the combinational circuit operates at the cycle time shorter than the signal propagation time of the critical path of the combinational circuit.

According to the logic circuit design methods of the fifth and sixth aspects, the processing speed of the logic circuit can be improved considerably without using a scheme of merely shortening the cycle time of the operation clock, nor merely shortening the signal propagation time of the critical path of a logic circuit.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

BRIEF DESCRIPTION OF THE DRAWINGS

FIG. 9 is a block diagram of an integer divider according to a third embodiment of the present invention.

DETAILED DESCRIPTION OF THE EMBODIMENTS

Figure 1:
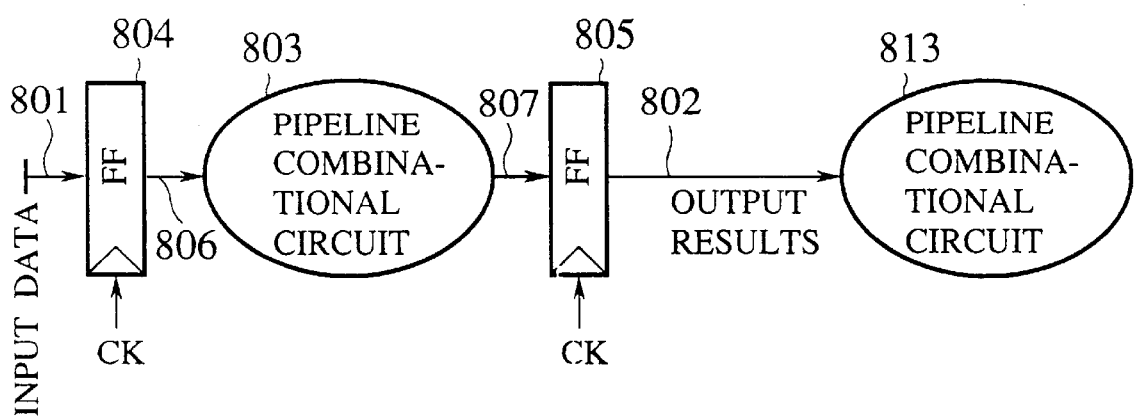
FIG. 1 is a block diagram showing a conventional logic circuit with a pipelined structure.
Figure 2:
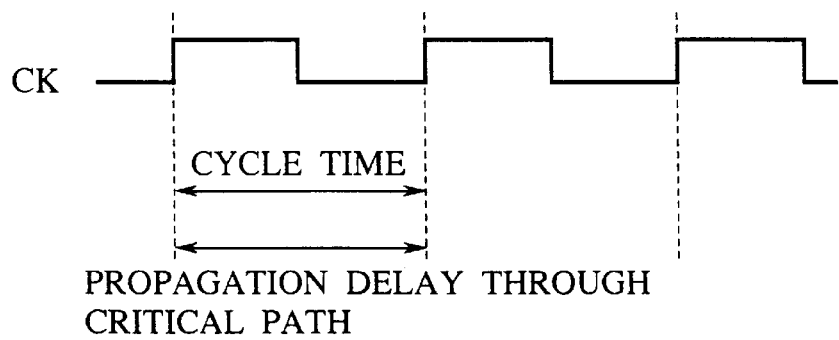
FIG. 2 shows the waveform of a clock input to the logic circuit shown in FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 3:
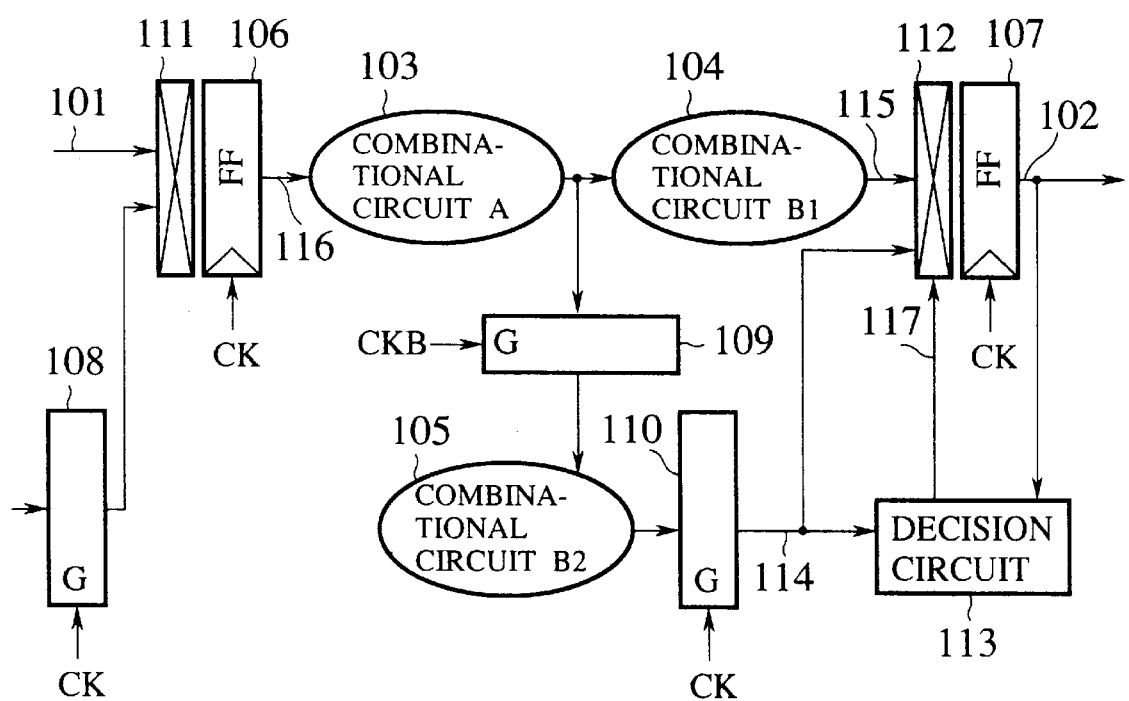
FIG. 3 is a block diagram showing a logic circuit according to a first embodiment of the present invention.

FIG. 3 is a block diagram of a logic circuit according to the first embodiment of the present invention. This logic circuit includes main combinational circuits 103 and 104 and a memory circuit 107 for holding an input signal or changing a held signal. The main combinational circuits 103 and 104 are a first combinational circuit A 103 and a second combinational circuit B1 104, respectively for receiving an input signal and outputting a predetermined signal in response to a clock signal. The logic circuit further includes a "signal generating means" which comprises: a latch 109 for inputting and latching an output signal from the first combinational circuit A 103 in response to an inverse signal CKB of the clock signal CK; a third combinational circuit B2 105 connected for the reception of an output signal of the latch 109 for generating an output signal similar to a signal output from the second combinational circuit B1 104 during a normal operation in response to the input signal from the latch 109; and a latch 110 for latching an output of the third combinational circuit B2 105 in response to the clock signal CK. The logic circuit further includes an "output signal decision means" and a "correcting means". The output signal decision means is a decision circuit 113 which judges whether the output signal of the second combinational circuit B1 104 is correct. The correcting means is a selector 112 which selects the output signal of the second combinational circuit B1 104 if the decision circuit 113 judges and decides that the output of the second combinational circuit B1 104 is correct, and selects the output signal of the third combinational circuit B2 105 if it judges and decides that the output of the second combinational circuit B1 104 is not correct. As an input signal to the latch 109, in addition to the signal from the first combinational circuit A 103, part or the whole of a signal 116 may be used.

Reference numerals 106 and 107 represent a flip-flop operating in response to the rising edge of the clock signal CK. Reference numerals 109, 110, and 108 represent a latch. These latches propagate a signal from the input to the output when the input clock is "1", and holds the signal when the input clock changes from "1" to "0". The latches 108 and 110 use the clock CK, and the latch 109 uses the inverse clock CKB. The waveforms of the clock signals CK and CKB used in the first embodiment of the invention are shown in FIG. 4.

Figure 4A:
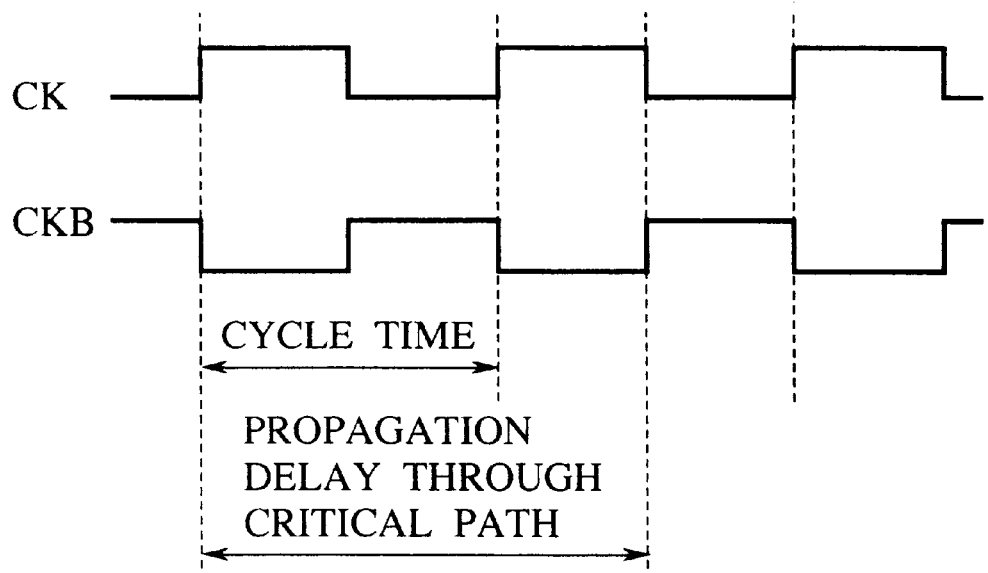
FIG. 4A shows the waveform of a clock input to the logic circuit shown in FIG. 3.

In FIG. 3, the equivalent circuit as the combinational circuit 103 shown in FIG. 1 is divided into two circuits, i.e., the first combinational circuit A 103 at the first half stage and the second combinational circuit B1 104 at the second half stage. The latches 109 and 110 and third combinational circuit B2 105 constitute the signal generator means for generating a correction signal. The logical function of the third combinational circuit B2 105 is the same as the second combinational circuit B1 104 and outputs a similar signal. The first combinational circuit A 103 is used in common by the second combinational circuit B1 104 and third combinational circuit B2 105 so that the increase of the area occupied by the logic circuit on the semiconductor chip can be minimized. An output signal of the second combinational circuit B1 104 is sampled by the flip-flop 107 at each cycle time. An output signal of the third combinational circuit B2 105 is sampled by the latch 110 after the longest signal propagation time, i.e., after the signal propagation time for the critical path (the second critical path) from the first combinational circuit A 103 to third combinational circuit B2 105 via latch 109. As shown in FIG. 4A, the cycle time is set shorter than the signal propagation time for the critical path (the first critical path) from the first combinational circuit A 103 to second combinational circuit B1 104.

Figure 4B:
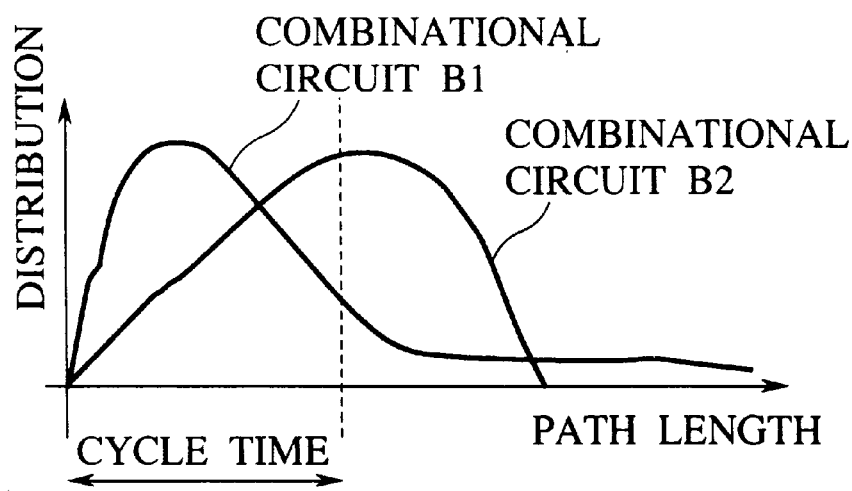
FIG. 4B is a diagram showing a use frequency (execution probability) distribution relative to a path length in combinational circuits B1 and B2 of the logic circuit shown in FIG. 3.

In the logic circuit of the first embodiment of the present invention shown in FIG. 3, for the case that some output signals must be derived from the second combinational circuit B1 104 through a path having a propagation time longer than the cycle time, the third combinational circuit B2 105 generates those signals. As shown in FIG. 4B, the third combinational circuit B2 is designed such that the critical path is made as short as possible although the paths with a high use frequency (probability) are long, and the second combinational circuit B1 is designed such that the peak position of the probability distribution resides in a shorter path region than that of third combinational circuit B2, although the critical path is longer. With this design, the performance of the logic circuit can be made more efficient.

Reference numeral 113 represents the decision circuit as the output signal decision means. This decision circuit 113 judges whether the output signal 115 of the second combinational circuit B1 104 is sampled after the necessary signal propagation time. The decision circuit 113 compares a signal 102 output from the second combinational circuit B1 104 with a signal 114 of the third combinational circuit B2 105. If the signals are not coincident, a control signal 117 is output so that the selector 112 selects the signal 114. The selector 112 is therefore the correcting means for correcting the signal held by the flip-flop 107.

Even if a path whose signal propagation time is longer than the settled cycle time is activated on the path of A 103 to B1 104, the output signal can be corrected by using the signal 114 obtained on the path of A 103 to 109 to B2 105, whose execution time is longer than the signal propagation time for the second critical path. As a result, this logic circuit can operate without any failure of the first combinational circuit A 103 and second combinational circuit B1 104 with the cycle time shorter than the signal propagation time for the first critical path in the combinational circuits A 103 and B 104.

In the logic circuit of the first embodiment of the invention shown in FIG. 3, since the output of the third combinational circuit B2 105 is sampled by the latch 110 in response to the clock signal CK, a path on the first combinational circuit A 103 to latch 109 and further to third combinational circuit B2 105 is assigned an execution time of 1.5 cycle time. Therefore, this logical circuit operates normally if the signal propagation time for the second critical path on 103 to 105 is shorter than 1.5 cycle time.

The signal propagation time of the latch 109 itself is very short. Therefore if the third combinational circuit B2 105 and the second combinational circuit B1 104 are quite the same, the first critical path on the first combinational circuit A 103 to the second combinational circuit B1 104 and the second critical path on the first combinational circuit A 103 to latch 109 and to third combinational circuit B2 105 have generally the same signal propagation time. Namely, in the logic circuit shown in FIG. 3, the first combinational circuit A 103 and second combinational circuit B1 104 can be operated in the cycle time of about ⅔ of the signal propagation time for the first critical path on 103 to 104.

Figure 5:
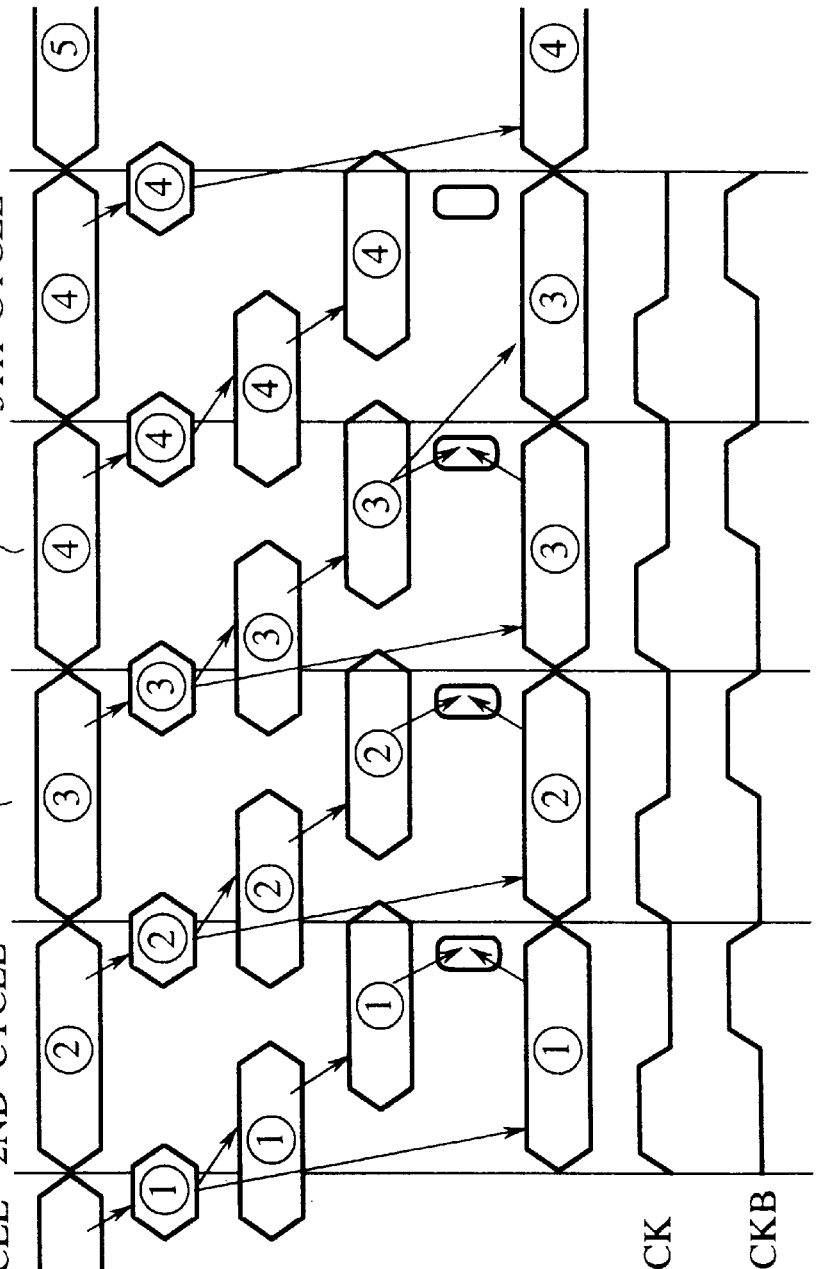
FIG. 5 is a timing chart illustrating the operation of the logic circuit of the first embodiment of the present invention shown in FIG. 3.

The operation of the logic circuit of the first embodiment shown in FIG. 3 will be described. FIG. 5 shows the operation timing of the logic circuit of the first embodiment. Reference numerals of signals shown in FIG. 5 correspond to those shown in FIG. 3.

First, the operation when the output signal is not corrected will be described. At the first cycle, a signal corresponding to the input signal 116 is generated. At the second cycle, the generated signal is output as an output signal 102. The correction signal 114 is generated after 1.5 cycles from the input signal 116, and is compared with the output signal 102 at the second half of the second cycle. If the value of the correction signal 114 is the same as the output signal 102, the output signal 102 is not necessary to be corrected. In this case, the signal 115 is selected by the selector 112 and input to the flip-flop 107. This signal is output as the output signal 102 at the third cycle 3.

Next, the operation when the output signal 102 is corrected will be described. In this operation example, it is assumed that the first critical path not covered by the cycle time is activated in the third cycle. At the fourth cycle, the output signal 102 of the logic circuit is compared with the correction signal 114. Since the comparison results do not indicate coincidence, at the fifth cycle the output signal is replaced by the correction signal. Since one cycle is consumed for the correction, the input signal 116 is not updated and remains (4). To this end, a latch 108 holds the value same as the signal 116 which is selected by a selector 111 and again written in the flip-flop 106. The output signal 102 at the fifth cycle is the correct value so that the decision circuit 113 does not operate.

Instead of the decision circuit 113 shown in FIG. 3, another output signal decision means may be provided which judges whether the output signal of the combinational circuit is correct, in accordance with a judgement whether the signal (sampled before the signal propagation time for the first critical path) is sampled after the lapse of time required for generating a proper signal. With the judgement whether the signal (sampled before the signal propagation time for the first critical path) is sampled after the lapse of time required for generating a proper signal, it is possible to judge whether the path not covered with a predetermined cycle is activated and to judge whether the output signal of the combinational circuit is correct. The judgement whether the output signal is correct can be made without waiting for the output of the signal generator means, so that high speed processing is possible.

The output signal decision means of the first embodiment may be provided with a prediction circuit for predicting a delay of an activated path in accordance with the input signal to thereby judge whether the output signal of the combinational circuit is correct. With the prediction circuit, the judgement is made without waiting for the output of the signal generator means, so that high speed processing is possible. The prediction circuit may be the circuit similar to those described with the fourth to seventh embodiments of the present invention to be described later.

Second Embodiment

Figure 6:
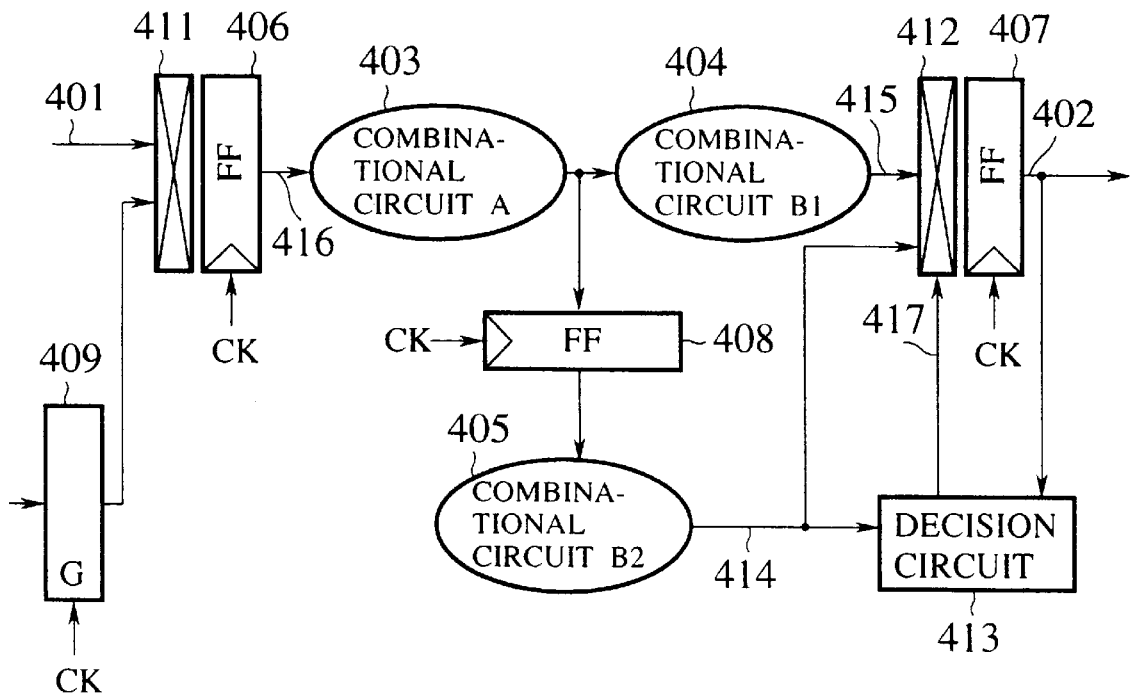
FIG. 6 is a block diagram showing a logic circuit according to a second embodiment of the present invention.

FIG. 6 is a block diagram of a logic circuit according to the second embodiment of the invention. A different point from the logic circuit of the first embodiment shown in FIG. 1 is a configuration of a pipeline structure, or the path for generating the correction signal. In the first embodiment shown in FIG. 3, two latches 109 and 110 are used, whereas in the second embodiment shown in FIG. 6, a flip-flop 408 is used. Therefore, in this logic circuit, the path of a first combinational circuit 403 to a second combinational circuit 404 is operated in one cycle, whereas the path of the first combinational circuit 403 to a selector 412, through flip-flop 408 and a third combinational circuit 405, is operated in two cycles. In the first embodiment, 1.5 cycles are assigned to the first combinational circuit A 103 to latch 109 and to third combinational circuit B2 105, and 0.5 cycles are assigned to the decision circuit 113 to the selector 112. Therefore, the structure of the second embodiment may become advantageous depending upon the signal propagation times of the combinational circuits, decision circuit, and selector. Specifically, as shown in FIG. 6, provision of the flip-flop 408 allows a time twice the cycle time to be assigned, after the input signal is fetched in response to the clock, to the path from the first combinational circuit 403 to the selector 412 (as the correcting means) through the third combinational circuit B2 405 (as the signal generator means) and the decision circuit 413 (as the output decision signal decision means). Therefore, as compared with the first embodiment using the latches, a longer time can be assigned to the path of the signal generator means for generating an output signal, when the output signal decision means and correcting means operate at high speed.

Figure 7:
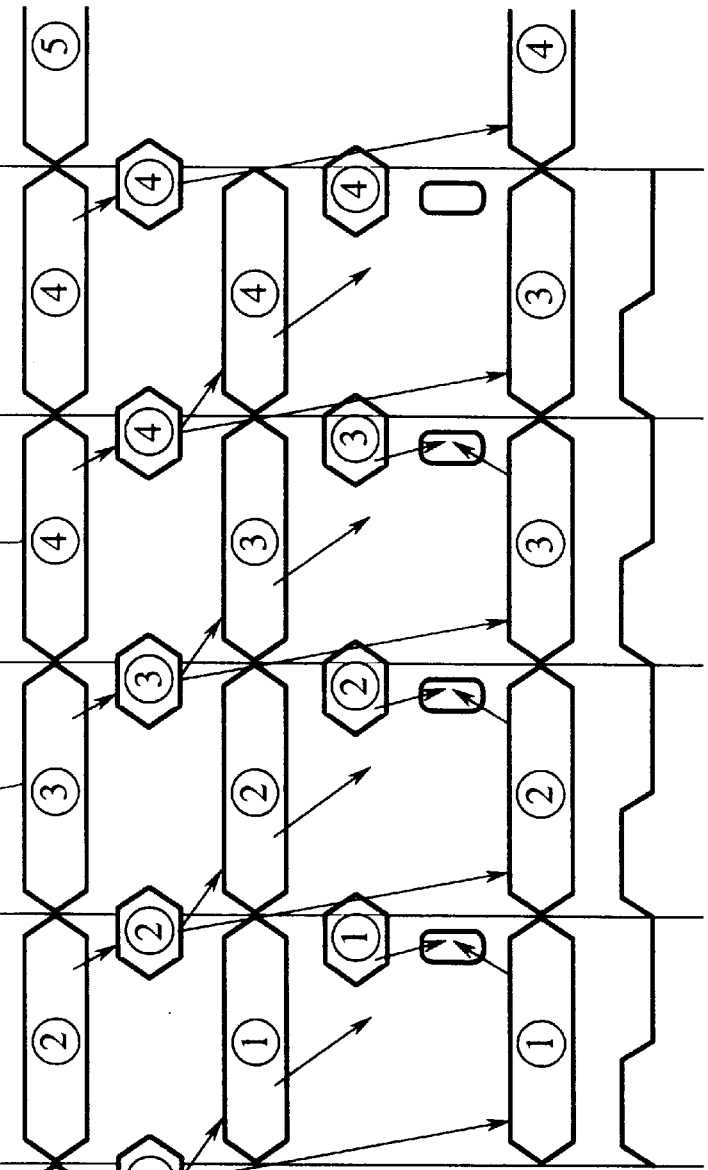
FIG. 7 is a diagram illustrating the operation of the logic circuit of the second embodiment of the present invention shown in FIG. 6.

The operation timings of the logic circuit shown in FIG. 6 are given in FIG. 7. In this example, it is assumed that the critical path is activated at the third cycle similar to FIG. 5 and the comparison for correction is performed at the fourth cycle. The fundamental operation is the same as FIG. 5.

Figure 8:
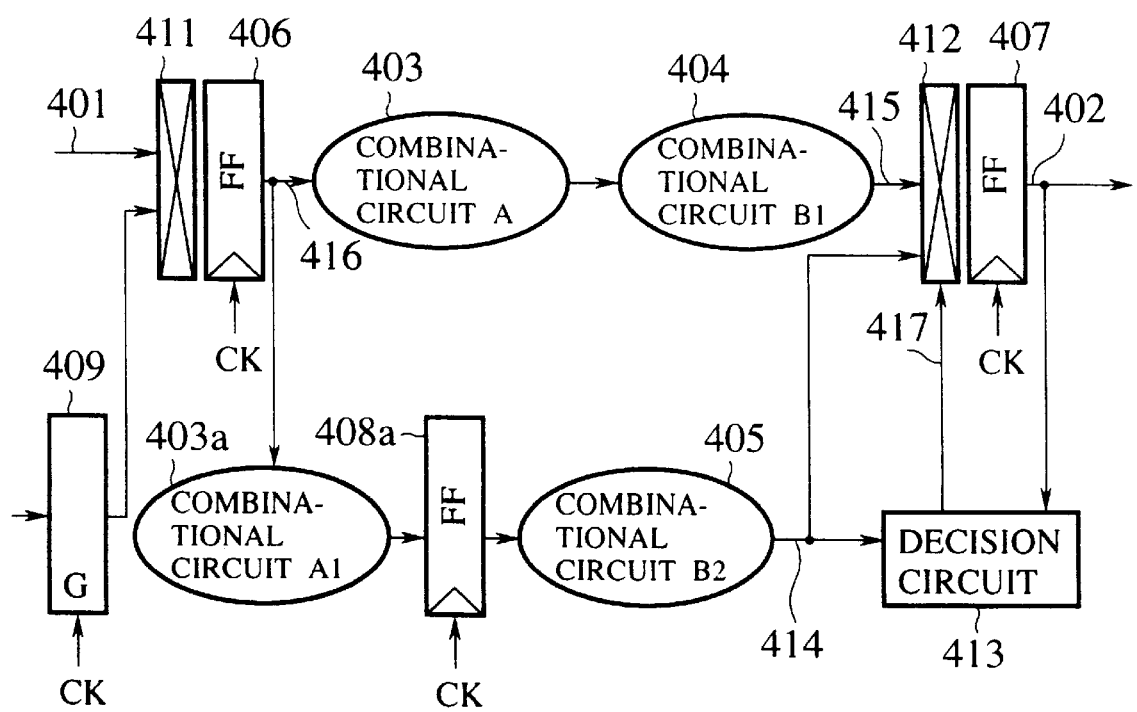
FIG. 8 is a block diagram showing a logic circuit according to a modification of the second embodiment of the present invention.

A modification of the second embodiment is shown in FIG. 8. As seen from FIG. 8, an output signal 416 of the flip-flop 406 is input to a fourth combinational circuit A1 403a. An output signal of the fourth combinational circuit A1 403a is input to the third combinational circuit B2 405 via a flip-flop 408a. These circuit connections are different from those shown in FIG. 6. Therefore, a path for generating the correction signal 414 is different.

With this structure, although the circuit scale becomes larger, the freedom of design for each combinational circuit increases. Therefore, optimization suitable for each application is possible. Specifically, as shown in FIG. 4B, the first and second combinational circuits 403 and 404 are designed so as to shorten a path with a high execution probability (use frequency), and the third and fourth combinational circuits 405 and 403a are designed so as to shorten the critical path although the peak of the probability distribution is positioned at the longer path side. With such design, the logic circuit can be operated with a shorter cycle time and less penalty for correction.

The flip-flop 408a has the same function as a combination of two latches 109 and 110 shown in FIG. 3, similar to the flip-flop 408.

In the modification of the second embodiment of the invention shown in FIG. 8, a signal input to the main combinational circuit, or the first and second combinational circuits 403 and 404, is also input to the signal generator means constituted by the third and fourth combinational circuits 403a and 405. In this case, the third and fourth combinational circuits 403a and 405 may generate, for the input signals to the main combinational circuit, only a fraction of same logic output signals as the main combinational circuits 403 and 404. To generate only a fraction of same logic output signals as the main combinational circuits 403 and 404 by the third and fourth combinational circuits 403 and 404, it is preferable that these combinational circuits are structured to have the signal propagation time for the critical path (the second critical path) through the third and fourth combinational circuits shorter than that of the first critical path through the main combinational circuits 403 and 404. Namely, by setting the signal propagation time for the second critical path shorter than that of the first critical path, the execution time for the penalty can be shortened when the penalty becomes necessary.

In the second embodiment shown in FIGS. 6 and 8, the decision circuit 413 compares the output signal 402 of the main combinational circuits 403 and 404 with the output signal of the signal generator means 403a and 405. Therefore, the judgement is possible without excessively increasing the amount of hardware. However, instead of the decision circuit 413, another output signal decision means may be provided which judges whether the output signal of the combinational circuit is correct, in accordance with a judgement whether the signal (sampled before the signal propagation time of the first critical path) is sampled after the time lapse required for generating a proper signal. With the judgement whether the signal (sampled before the signal propagation time of the first critical path) is sampled after the necessary time lapse for generating a proper signal, it is possible to judge whether the path not covered with a predetermined cycle is activated and to judge whether the output signal of the combinational circuit is correct. The judgement whether the output signal is correct can be made without waiting for the output of the signal generator means, so that high speed processing is possible.

The output signal decision means may be provided with a prediction circuit for predicting a delay of an activated path in accordance with the input signal to thereby judge whether the output signal of the combinational circuit is correct. With the prediction circuit, the judgement is made without waiting for the output of the signal generator means, so that high speed processing is possible.

Third Embodiment

A block diagram is given which shows a more specific example according to the third embodiment of the invention. FIG. 9 shows a 32-bit unsigned integer divider according to the third embodiment of the invention. This 32-bit unsigned integer divider is designed by a logic circuit design method by which a predetermined clock cycle is set shorter than the critical path of a combinational circuit, and a circuit for correcting an output signal is provided for the case wherein a path not covered by this cycle is activated. The logic circuit designed by this design method can execute a restoring division at high speed with 2-bit per cycle.

As shown in FIG. 9, the logic circuit of the third embodiment is a restoring divider which comprises: first holding means 604 for holding at least a dividend; a first subtractor 620 for inputting the dividend and a divisor held by the first holding means 604 and executing subtraction of the input data; first selection means 617 for inputting the subtraction results by the first subtractor 620 and the dividend and selecting and outputting the input data in accordance with a first selection signal; a second subtractor 621 for inputting an output of the first selection means 617 and the divisor and executing subtraction of the input data; second selection means 618 for inputting outputs of the second subtractor 621 and the first selection means 617 and selecting and outputting the input data in accordance with a second selection signal; and third selection means 603 for inputting at least an output of the second selection means 618 and the dividend 602 and selecting the input data in accordance with a third selection signal and outputting the selected input data to the first holding means 604. The divider of the third embodiment of the invention further comprises: second holding means 637 for holding an output of the first selection means 617; a third subtractor 622 for inputting an output of the first selection means held by the second holding means 637 and the divisor and executing subtraction of the input data; fourth selection means 619 for inputting outputs of the third subtractor 622 and the second holding means 637 and selecting and outputting the input data in accordance with a fourth selection signal; third holding means 631 responsive to a first clock for holding output data of the fourth selection means 619; fifth selection means 634 for inputting data held by the third holding means 631 and data output from the second selection means 618 and selecting the input data in accordance with a fifth selection signal and outputting the selected data to the third selection means 603; and comparator means 628 for inputting data held by the third holding means 631 and data held by the first holding means 604 and executing comparison between the input data and outputting the fifth selection signal.

Referring to FIG. 9, a 32-bit dividend is input as a signal 602, and a 32-bit divisor is input as a signal 601. Reference numeral 604 represents a 64-bit flip--flop which holds after calculation a remainder as the upper 32 bits and a quotient as the lower 32 bits. The first subtractor 620, second subtractor 621, and third subtractor 622 are each a 32-bit adder. This adder is used in practice as a subtractor to which an inverted operand is input and a carry is input to the lowest bit or the least significant bit (LSB) position. The second subtractor 621 is a subtractor having a ripple-carry adder and the third subtractor 622 is a subtractor with a carry-save adder.

The ripple-carry adder is constituted by one-bit adders corresponding in number to the predetermined number of bits and connected in cascade so as to relay a carry for the addition of the predetermined number of bits. Therefore, the carry at the most significant bit (MSB) position generally forms a critical path, and other outputs such as SUM and Carry have a relatively short signal propagation time. The carry-save adder is constituted by one-bit adders corresponding in number to the predetermined number of bits and connected in cascade so as to perform calculations for both with a carry and without a carry. It is judged from the lower bit calculation results whether there is a carry, and one of the calculation results for both with a carry and without a carry is output. With this carry-save adder, the carry at the MSB position generally forms a critical path whose signal propagation time is shorter than that of the ripple-carry adder, and other outputs have a relatively longer signal propagation time than the ripple-carry adder. With the above structure, the second subtractor 621 shown in FIG. 9 is provided with a ripple-carry adder which has generally a long signal propagation time for the critical path and relatively short signal propagation times for other signals. Therefore, even if the clock cycle time for the operation of the second subtractor 621 is made short, a probability of a penalty process can be reduced. Furthermore, the third subtractor 622 is provided with a carry-save adder which has generally a short critical path and longer signal propagation times for other signals than the second subtractor 621. Therefore, even if there is a penalty process, the cycle time can be shortened.

Reference numeral 606 represents an inverter with a 32-bit width used for the second and third subtractors 621 and 622. Reference numerals 617, 618, and 619 represent a selector which is controlled by a carry output of the adder immediately before the selector. If the carry signal is "1", an output of the adder is selected, whereas if it is "0", a signal before the addition is selected. This carry itself is a one-bit quotient of the division.

As described earlier, this divider calculates a two-bit quotient per one cycle by using the adders 620 and 621. In the third embodiment of this invention, output signals 613 and 615 of the adder 621 at the succeeding stage can be corrected. For generating the correction signal, an adder 622, a selector 619, and latches 637 and 631 are additionally provided.

Reference numeral 628 represents a 32-bit width comparator which judges whether the signals 613 and 615 are sampled at the necessary time. A signal 626 has a signal value of the corrected signal 608. The comparator 628 compares a signal 627 after sampling with a signal 635 for correcting the signal value. If both the signals are not coincident, a selector 634 selects a corrected signal 626.

Figure 10A:
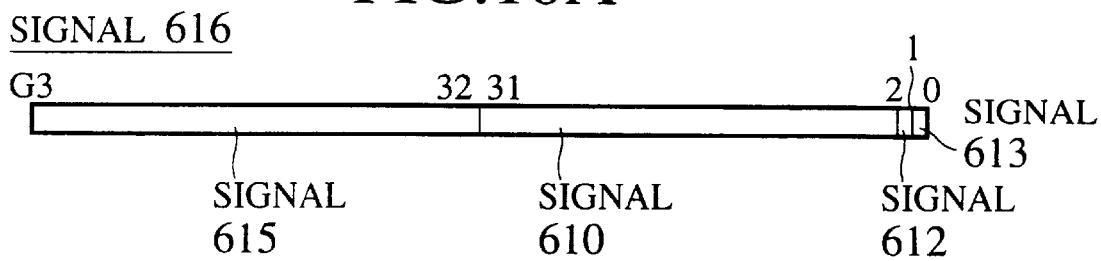
FIGS. 10A to 10D illustrate signal linking and separation in the divider of the third embodiment of the present invention shown in FIG. 9.

Interconnection between signals of the integer divider of the third embodiment of the invention shown in FIG. 9 will be detailed with reference to FIGS. 10A to 10D. In FIGS. 10A to 10D, signals at upper bits are shown at the left side and signals at lower bits are shown at the right side. The lowest bit is called 0th bit, and toward the upper bits, they are called 1st bit, 2nd bit, 3rd bit, . . . . As shown in FIG. 10A, a signal 616 is constituted by a signal 615 representative of a partial remainder calculated at the corresponding cycle, a signal 610 representative of lower 30 bits of the flip-flop 604, and carry signals 612 and 613 of the two adders, respectively linked at the positions shown in FIG. 10A.

Figure 10B:
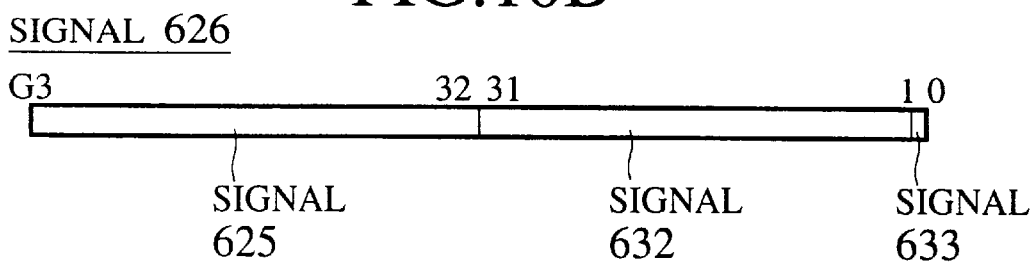

As shown in FIG. 10B, a signal 626 is constituted by a signal 625 representative of a partial remainder 625 generated for correction, a signal 632 representative of the 31st bit to 1st bit of the flip-flop 604, and a signal 633 representative of the latched carry output of the adder 622, respectively linked at the positions shown in FIG. 10B.

Figure 10C:
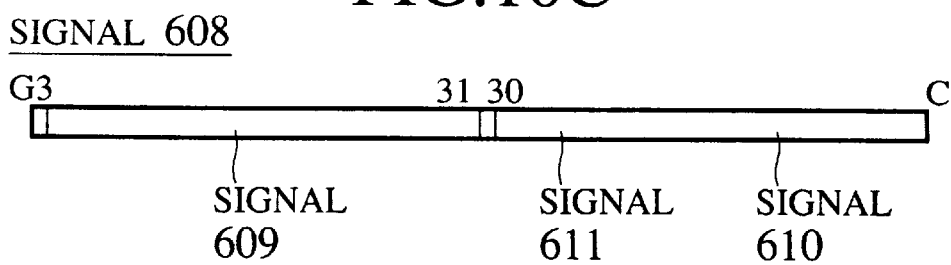

A signal 608 shown in FIG. 10C is an output signal of the flip-flop 604 which holds the remainder at the upper 32 bits and the quotient at the lower 32 bits after the calculation and outputs them. During the calculation, a signal 609 representative of the 62nd bit to 31st bit is output to the adder 620 and the 30th bit is output to the adder 621. The 29th bit to 0th bits are output as a signal 616 because these bits shift to the left.

Figure 10D:
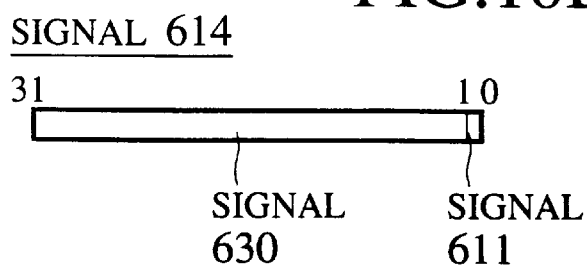

As shown in FIG. 10D, a signal 614 is constituted by a signal 630 representative of a partial remainder calculated by using the preceding adder 620 and selector and a signal 611 separated from the signal 608, respectively linked at the positions shown in FIG. 10D.

Although not shown in FIGS. 10A to 10D, a signal 627 is a 33-bit width signal of the upper 32 bits and lowest one bit of the signal 608 linked together. A signal 635 is a linked signal of signals 625 and 633. In this case, the signals are linked so that the lower bits of the signals 633 and 608 are arranged at the same bit position.

This divider serially uses the two adders 620 and 621 to obtain a quotient by 2 bits per cycle. The arithmetic results at each cycle are on the signal 616. In this divider, the signal 616 is sampled by the flip-flop 604 at the cycle shorter than the signal propagation time for the critical path. A correction signal is generated by the adder 622 and its peripheral circuits, for the case wherein a path having a signal propagation time longer than the cycle time is activated. The two adders operate serially so that the carry output 612 of the preceding adder 620 can be generated in the cycle time and the correction signal for this is not generated.

The integer divider of the third embodiment of the invention also uses the clock signals CK and CKB shown in FIG. 4A. The latches 636 and 631 use the clock signal CK and samples the correction signals 623 and 624 at the falling edge of the clock CK. Therefore, if the signal propagation time of the critical path for generating the correction signals is shorter than 1.5 cycles, this divider circuit operates normally. The critical path for generating the signal 616 and the critical path for generating the correction signals 623 and 624 are generally the same length so that the circuit generating the signal 616 of the divider circuit can operate at the cycle time of $2/3$ of the critical path length.

As appreciated, the effects of the invention depend on a probability distribution of paths of the logic circuit (as shown in FIG. 4B). Generally speaking, the critical path is rarely activated, and most of the paths can be operated in a time considerably shorter than the signal propagation time of the critical path. For example, the divider of the third embodiment of the invention shown in FIG. 9 was designed with a 0.5 $\mu$m rule of CMOS technology and checked with a dynamic timing analysis tool. And the probability of a penalty process at each cycle was only 0.25% when the divider was operated at a cycle time of 75% of the signal propagation time for the critical path.

Fourth Embodiment

Figure 11A:
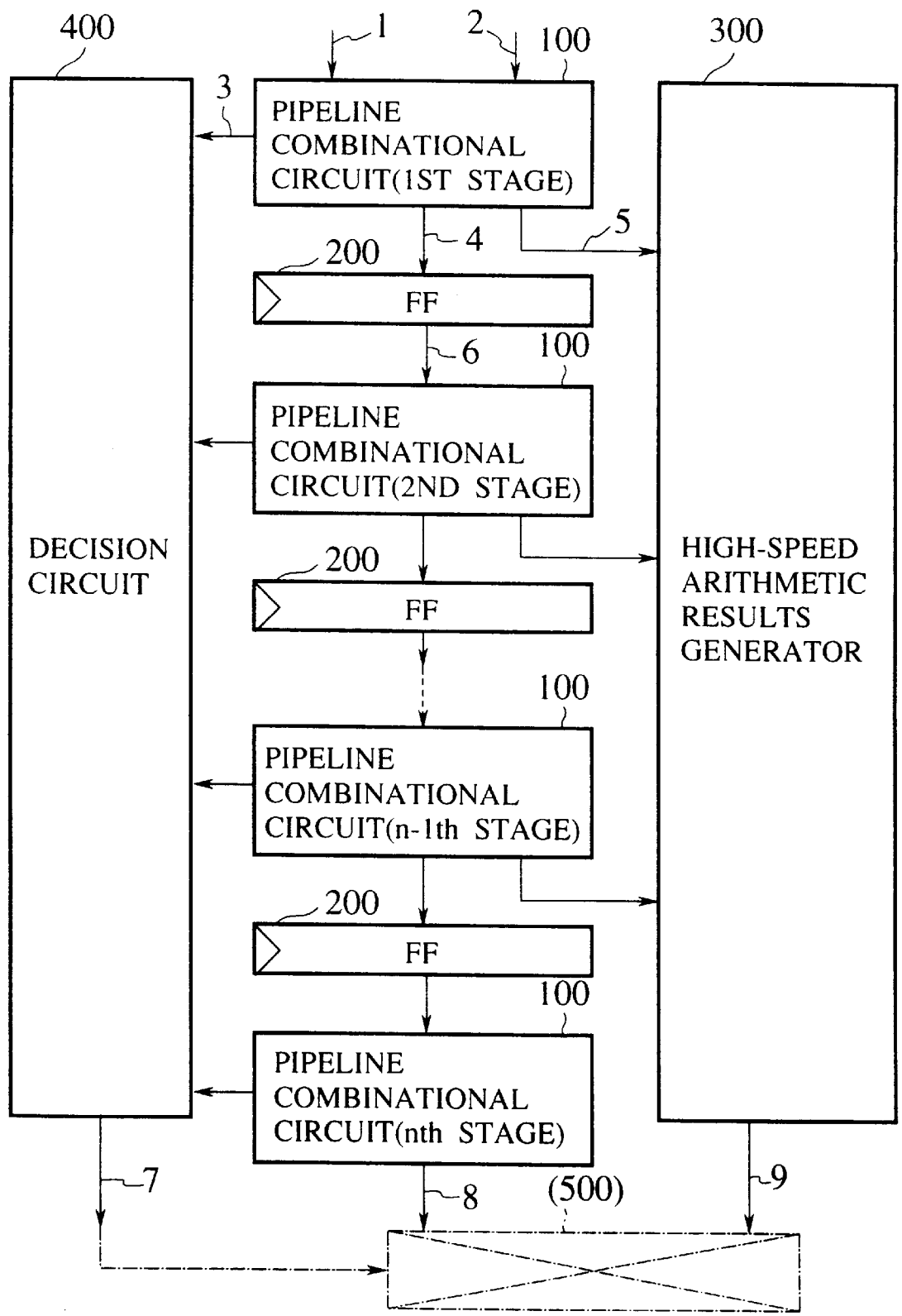
FIG. 11A is a block diagram showing a logic circuit according to a fourth embodiment of the present invention.

FIG. 11A is a block diagram of the logic circuit according to the fourth embodiment of the invention. The logic circuit shown in FIG. 11A has at each stage (1st to n-th stages) a pipeline combinational circuit (a pipeline processor) 100 for arithmetic operation and a flip-flop 200 for holding the arithmetic results of the pipeline combinational circuit 100 and outputting the results to the next stage pipeline combinational circuit 100. By using the arithmetic results held by the flip-flop 200, the next stage pipeline combinational circuit 100 executes an arithmetic operation through pipeline processing. The logic circuit further includes a high-speed arithmetic results generator 300 for receiving the high-speed intermediate arithmetic results 5 of the pipeline combinational circuit 100 among a plurality of pipeline combinational circuits 100 and generating and outputting the high-speed arithmetic results 9, and a decision circuit 400 for outputting a decision signal 7 by judging from the type of calculation or operand data processed by the intermediate pipeline combinational circuit 100 whether the high-speed arithmetic result 9 is valid or not.

Figure 11B:
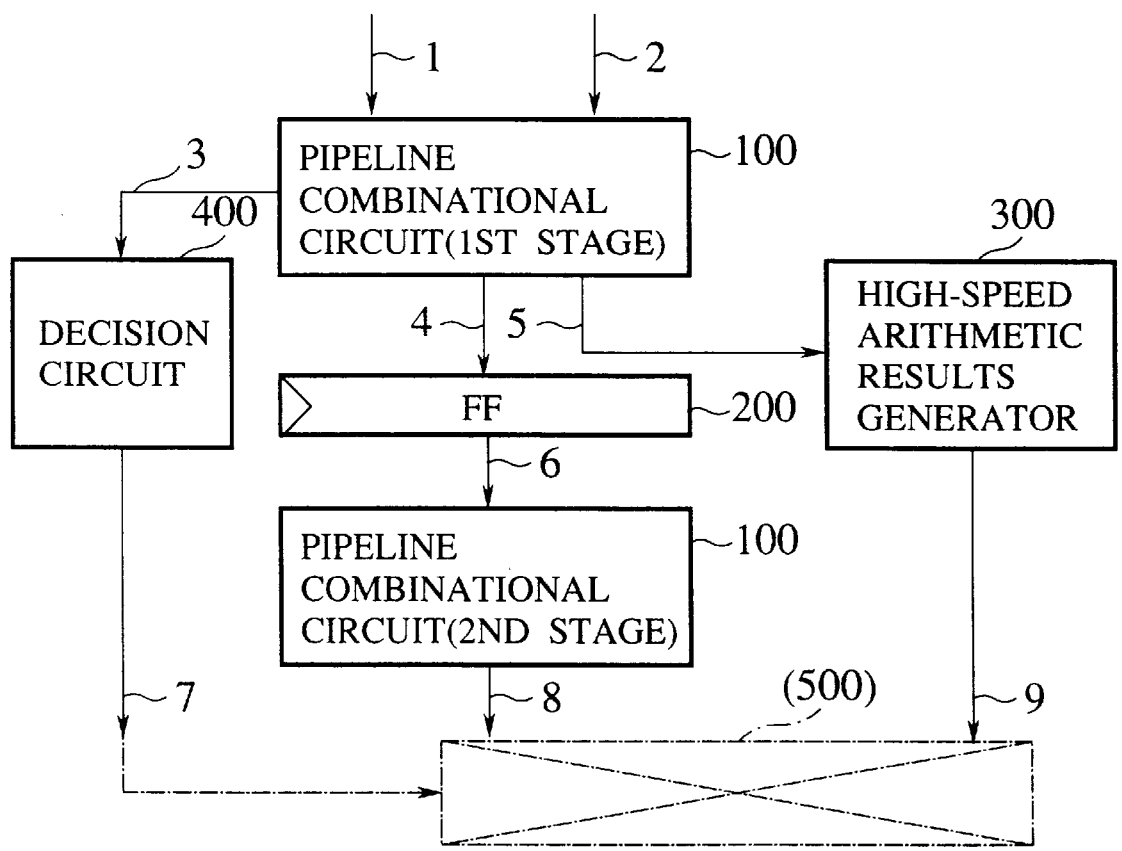
FIG. 11B is a block diagram of showing the simplified modification of the logic circuit according to the fourth embodiment of the present invention.

FIG. 11B is a block diagram of a logic circuit of the simplified modification of the fourth embodiment of the present invention wherein the number of stages of the pipeline structure shown in FIG. 11A is set to two in order to make it easy to explain and understand. The operation of the logic circuit shown in FIG. 11B will be described. Operand data input signals 1 and 2 are input to the first stage pipeline combinational circuit 100 which executes the first stage calculation. The main intermediate arithmetic results 4 of the first stage pipeline combinational circuit 100 are temporarily held by the flip-flop 200, and at the next clock, the main intermediate arithmetic results 6 are input to the second stage pipeline combinational circuit 100 which executes a predetermined calculation and outputs final arithmetic results 8.

The high-speed intermediate arithmetic results 5 of the first stage pipeline combinational circuit 100 are input to the high-speed arithmetic results generator 300 which generates the arithmetic results at the first stage and outputs them as high-speed arithmetic results 9. Whether the calculation can be completed at the first stage is determined by the decision circuit 400 by using a intermediate arithmetic signal 3, and a decision signal 7 is output from the decision circuit 400. The combinational circuit for executing the next calculation by using the arithmetic results of the preceding combinational circuit determines from the decision signal 7 whether the final arithmetic results 8 or the high-speed arithmetic results 9 are used.

In the logic circuit of the fourth embodiment of the invention, for the operand data of a certain type whose calculation can be executed in a short time, the high-speed arithmetic results 9 through the pipeline first stage combinational circuit 100 and the high-speed arithmetic results generator 300 are generated and output. Therefore, the operation cycle of the logic circuit can be shortened. At the same time, for the operand whose calculation can be completed at the first stage, the high-speed intermediate arithmetic results are output at the first stage to reduce latency.

Figure 12A:
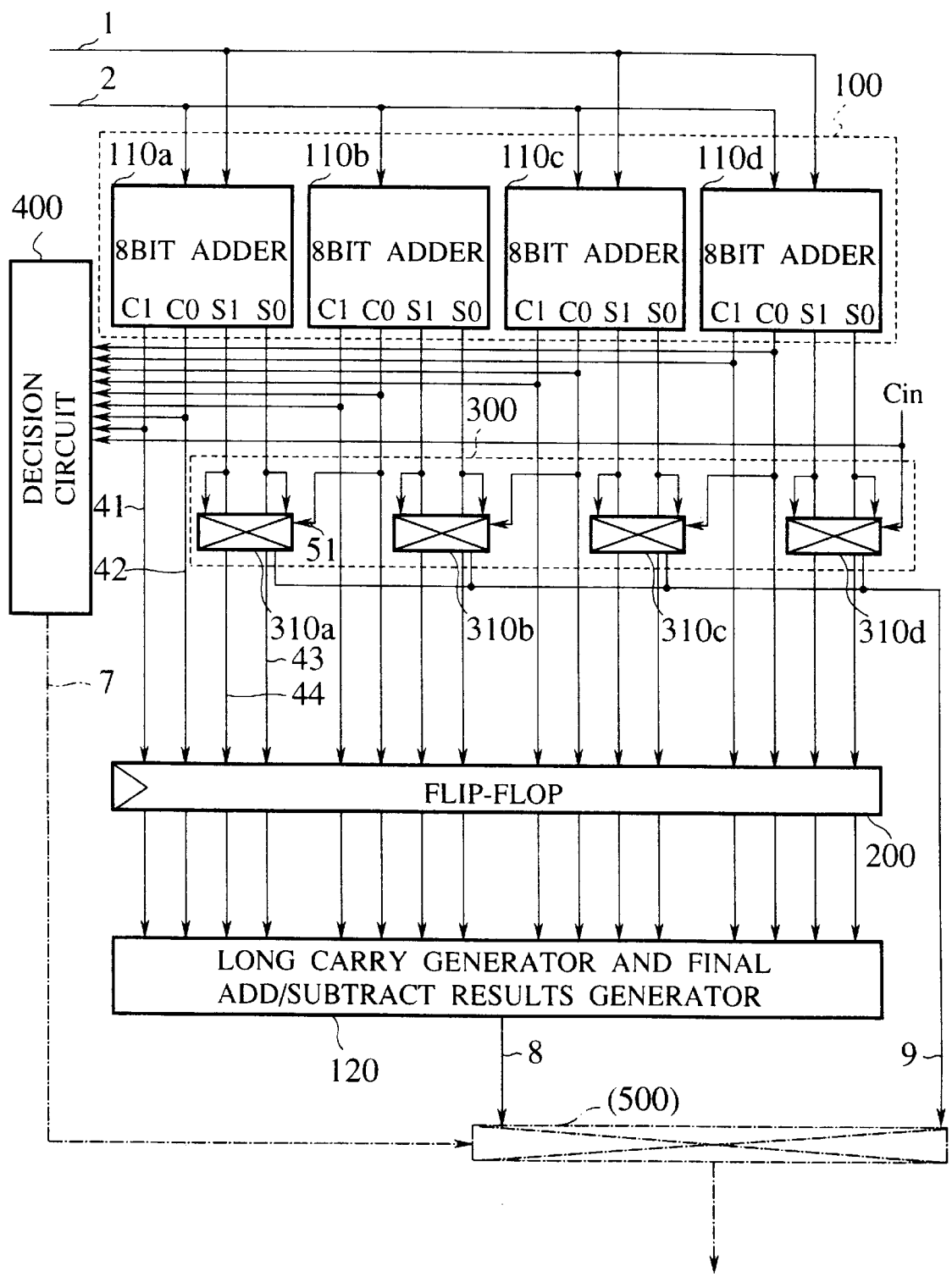
FIG. 12A is a block diagram showing the specific and detailed structure of a 32-bit adder/subtractor according to the fourth embodiment of the invention.

FIG. 12A shows a specific structure of the logic circuit of the fourth embodiment of the invention. The logic circuit shown in FIG. 12A is a 32-bit adder/subtractor circuit. In the pipeline structure of this 32-bit adder/subtractor circuit, the first stage pipeline combinational circuit 100 is divided into four circuit sections each constituted by 8 bits. Reference numerals 110a, 110b, 110c, and 110d represent a circuit section for executing 8-bit addition and subtraction, and each circuit section generates arithmetic results 44 with a carry input and arithmetic results 43 without a carry input. At the same time, each circuit section generates a carry output 41 for the arithmetic results 44 and a carry output 42 for the arithmetic results 43.

The arithmetic results 43 and 44 are selected by each of selectors 310a, 310b, 310c, and 310d constituting a high-speed arithmetic results generator 300, in accordance with a carry output signal 51 from the lower bit stage circuit section, to thereby output the intermediate arithmetic results 9. The carry output signal 51 is an carry output associated with the arithmetic results at the circuit section without a carry input. The selectors 310a, 310b, 310c, and 310d select the arithmetic results 43 when the signal 51 takes a value "0" i.e., when there is no carry. Therefore, for the operand data with a carry propagation at the 8th bit or lower, the intermediate arithmetic results 9 are output as valid arithmetic results.

The arithmetic results of the 8-bit adder/subtractor circuit 110 are fetched by the flip-flop 200 at the final operation cycle, and supplied to along carry generator and final add/subtract results generator 120. This generator 120 calculates the total carry propagation to select the proper arithmetic results and output the final arithmetic results 8. The final arithmetic results 8 and intermediate arithmetic results 9 may be selected by a selector 500 by using the decision signal 7 of the decision circuit 400 or may be selected by another circuit structure, to thereby output the proper arithmetic results to the second stage combinational circuit.

Figure 12B:
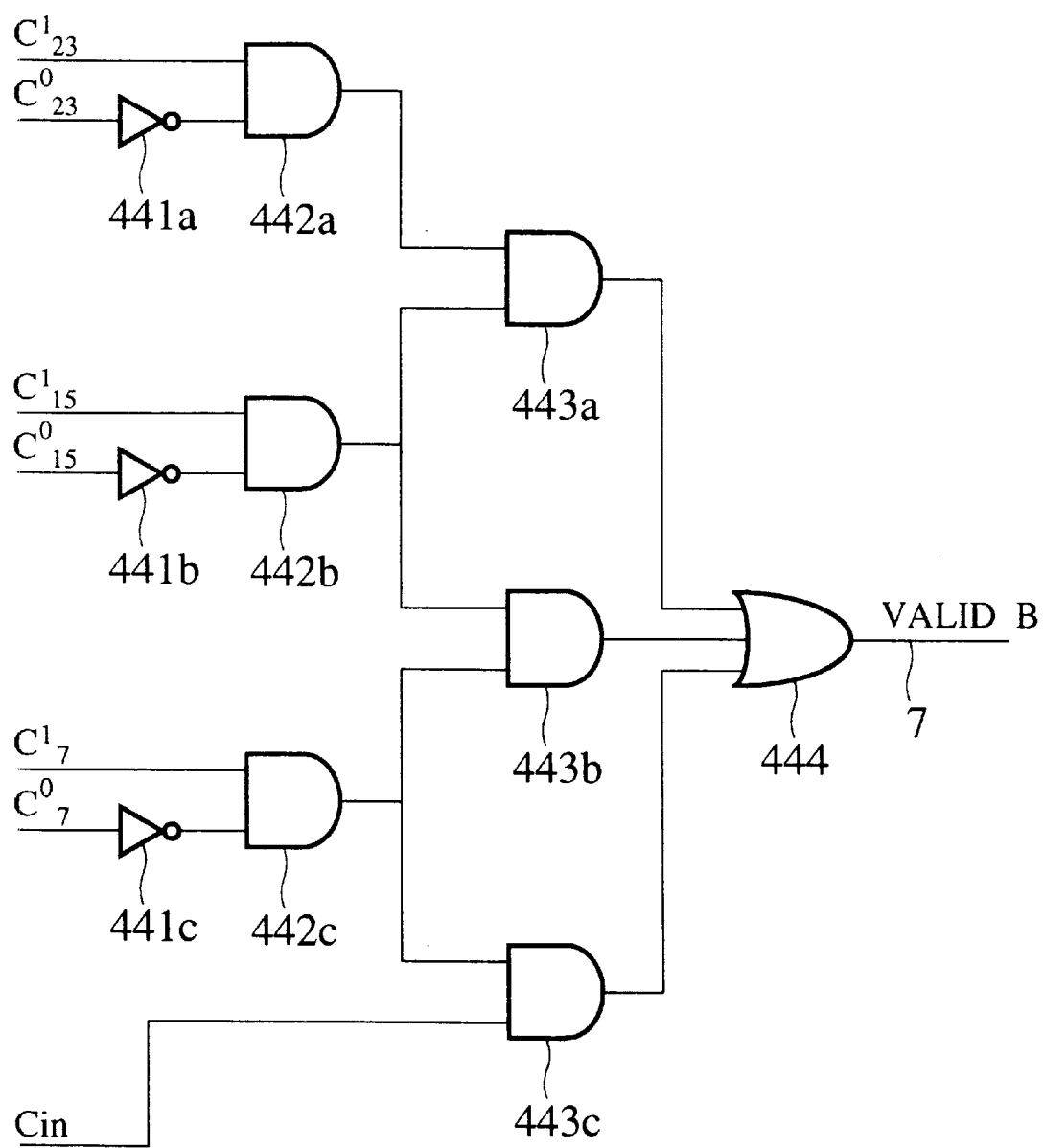
FIG. 12B is a block diagram showing a decision circuit for the 32-bit adder/subtractor shown in FIG. 12A.

FIG. 12B shows an example of the decision circuit 400 of the adder/subtractor circuit shown in FIG. 12A. A decision signal 7 of "1" indicates that the intermediate arithmetic results are invalid. An input to this decision circuit is a carry output of the 8-bit adder/subtractor circuit section 110a, 110b, 110c, 110d shown in FIG. 12A. $C^1n$ represents a carry output from the n-th bit of the arithmetic results when there is a carry input to the circuit section. Con represents a carry output from the n-th bit of the arithmetic results when there is no carry input to the circuit section. If $C^1n$ is "1" and $C^0n$ is "0", this section is in a carry propagation state. If the consecutive two circuit sections are in the carry propagation state, the intermediate arithmetic results are invalid.

The adder/subtractor circuit shown in FIG. 12A is pipelined so that it operates with a short cycle time. If the carry propagation is eight bits or smaller, the arithmetic results are output at the first stage of the pipeline. In the case of addition and subtraction, the carry propagation during calculations of most operands is eighth bits or smaller. Therefore, this adder/subtractor circuit operates with small latency in most cases.

Fifth Embodiment

Figure 13:
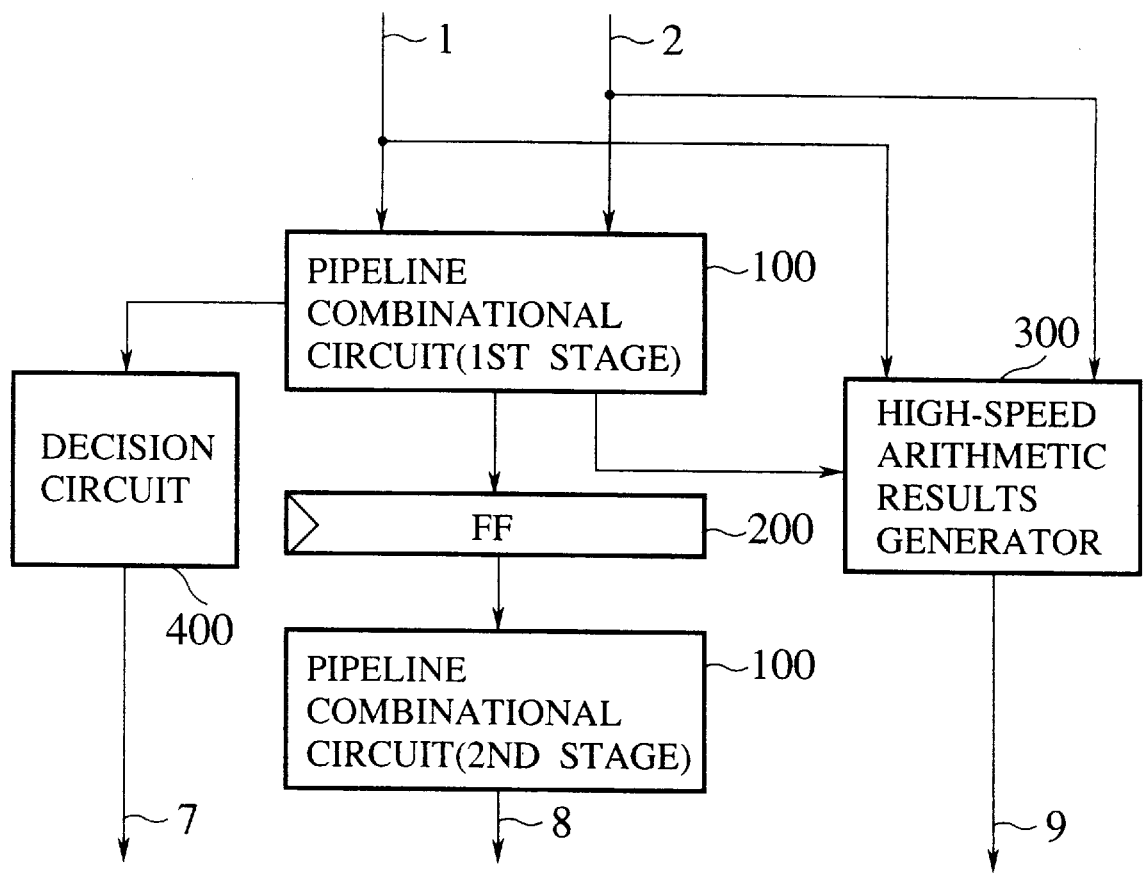
FIG. 13 is a block diagram showing a logic circuit according to a fifth embodiment of the present invention.

FIG. 13 is a block diagram of a logic circuit according to the fifth embodiment of the invention. A high-speed arithmetic results generator 300 of the logic circuit shown in FIG. 13 directly receives operand data signals 1 and 2 and generates high-speed arithmetic results 9. Although the structure having the independent high-speed arithmetic results generator 300 increases the circuit scale, the arithmetic results 8, 9 can be obtained faster so that further optimization becomes possible.

Sixth Embodiment

Figure 14:
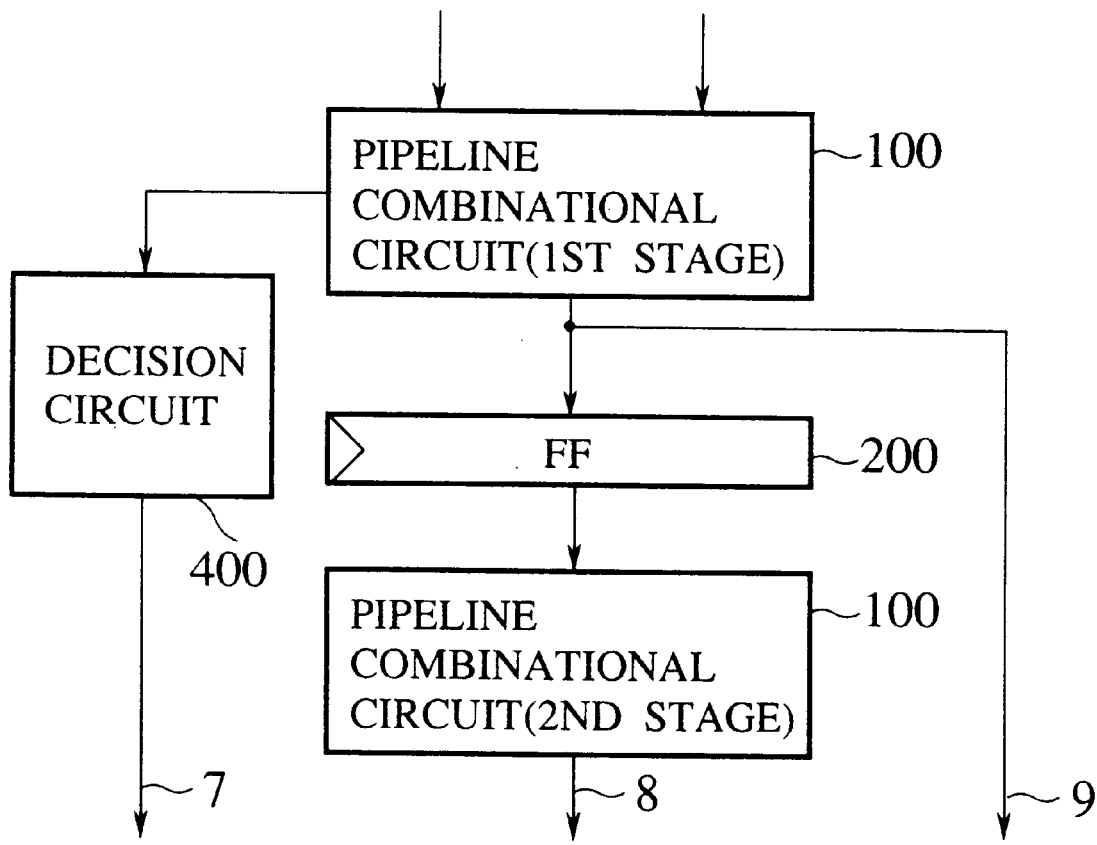
FIG. 14 is a block diagram showing a logic circuit according to a sixth embodiment of the present invention.

FIG. 14 is a block diagram of a logic circuit according to the sixth embodiment of the invention. In this logic circuit shown in FIG. 14, the high-speed arithmetic results generator 300 such as shown in FIG. 11B and the other figures is omitted. Namely, the first stage pipeline combinational circuit 100 is used also for the high-speed arithmetic results generator 300. Depending upon the type of calculation, the main intermediate arithmetic results of the pipeline combinational circuit 100 can be output as the high-speed arithmetic results 9. In such a case, the logic circuit shown in FIG. 14 can suppress an increase of hardware and the arithmetic results can be obtained at high speed.

Seventh Embodiment

Figure 15:
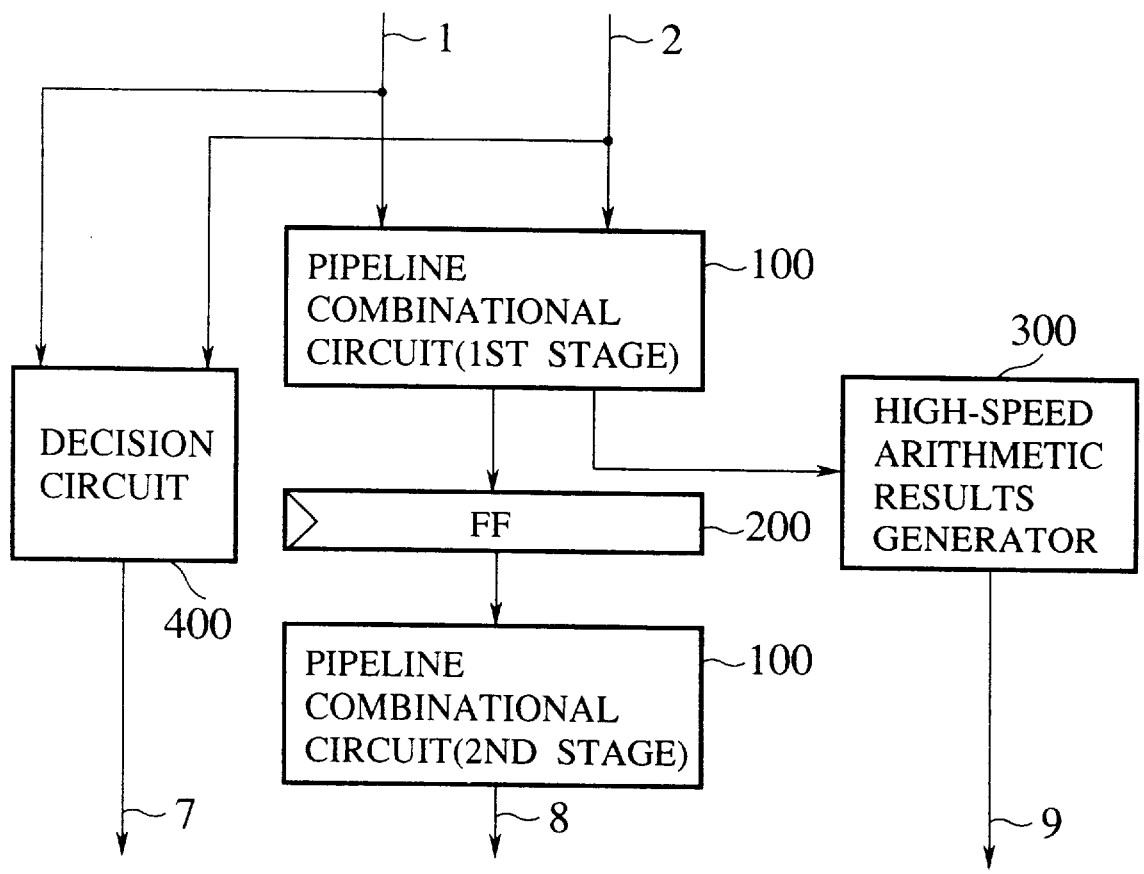
FIG. 15 is a block diagram showing a logic circuit according to a seventh embodiment of the present invention.

FIG. 15 is a block diagram of a logic circuit according to the seventh embodiment of the invention. A decision circuit 400 of the logic circuit shown in FIG. 15 directly receives operand data signals 1 and 2 and generates a decision signal 7. Depending upon the type of calculation, whether the high-speed arithmetic results 9 are valid can be determined from operand data 1, 2. In such a case, as shown in FIG. 15, the intermediate arithmetic signals 3 shown in FIG. 11B are not used and the decision circuit 400 with an independent structure can generate the decision signal 7 quickly.

Various modifications will become possible for those skilled in the art after receiving the teachings of the present disclosure without departing from the scope thereof. For example, the circuit for generating a correction signal in the first to third embodiments of the invention is not necessary to be the same as part of the main circuit. As the means for judging whether the signal is sampled after the necessary signal propagation time, a circuit other then the decision circuit may be used. For example, an asynchronous circuit or the like generates a signal indicating the end of the circuit operation. Such a signal may be used as the judging means.

In the first to third embodiments, a path for a generated correction signal has one flip-flop or two latches. In other words, this path operates by two cycles. The number of flip-flops or latches is not limited to the above embodiments, but it may be increased to operate the logic circuit with a shorter cycle time.

In the first to third embodiments, the logic circuit is operated with a shorter cycle time than the signal propagation time for the critical path length. If a path not covered with this cycle time is activated, the time is required for correcting the output signal. In the first to third embodiments, the penalty for correction requires one cycle. The number of cycles of the penalty for correction becomes different depending upon the circuit designs and the fabrication methods and is not limited to the embodiments. If the number of stages of signal generator means is increased, a time assigned to the path for the signal generator means is prolonged although the number of penalty processes increases. Therefore, the number of stages of signal holding means is determined so as to realize a fastest process speed.

In the fourth to seventh embodiments of the invention, an output timing of the decision signal is not described. It is desired to output the decision signal quickly from the viewpoint of system configuration. Even if the decision signal is output after high-speed arithmetic results are output, it is possible to configure a suitable system.

What is claimed is:

1. A logic circuit for performing a restoring-division, comprising:

first holding means for holding at least a dividend;

a first subtractor for inputting the dividend held by said first holding means and for inputting a divisor, said first subtractor executing subtraction of the input data;

first selection means for inputting the subtraction results by the first subtractor and the divisor and executing and outputting the input data in accordance with a first selection signal;

a second subtractor for inputting an output of said first selection means and the divisor and executing subtraction of the input data;

second selection means for inputting outputs of the second subtractor and said first selection means and selecting and outputting the input data in accordance with a second selection signal, said second selection means having a first critical path and having a first peak position of use probability as to path length;

third selection means for inputting at least an output of said second selection means and the dividend and selecting the input data in accordance with a third selection signal and outputting the selected input data to said first holding means;

second holding means for holding an output of said first selection means;

a third subtractor for inputting an output of said first selection means held by said second holding means and the divisor and executing subtraction of the input data, the third subtractor having a second critical path shorter than the first critical path, and having a second peak position longer than the first peak position of use probability;

fourth selection means for inputting outputs of said third subtractor and said second holding means and selecting and outputting the input data in accordance with a fourth selection signal;

third holding means for holding output data of said fourth selection means;

fifth selection means for inputting data held by said third holding means and data output from said second selection means and selecting the input data in accordance with a fifth selection signal and outputting the selected data to said third selection means; and comparator means for inputting data held by said third holding means and data held by said first holding means and executing comparison between the input data and outputting the fifth selection signal, wherein a first combination that includes the first and second subtractors but not the third subtractor, and a second combination that includes the first and third subtractors but not the second subtractor, execute respectively a same arithmetic operation with same input data, and wherein the first combination is assigned to have an execution time of one cycle time, and the second combination is assigned to have an execution time of one and one-half cycle time.

2. The logic circuit of claim 1, wherein said second subtractor is a subtractor with a ripple-carry adder, and said third subtractor is a subtractor with a carry-save adder.

3. A logic circuit having a pipelined structure, comprising:

a sequence of combinational circuits;

a flip-flop electrically coupled between the combinational circuits at an earlier pipeline stage and a next pipeline stage;

a high-speed arithmetic results generator for receiving high-speed intermediate arithmetic results from the combinational circuit at the earlier pipeline stage, and generating and outputting high-speed arithmetic results; and a decision circuit for judging from the type of calculation or operand data to be processed by the combinational circuit at the earlier pipeline stage, during calculation whether said high-speed arithmetic results are valid, and outputting a decision signal, the decision signal being used to determine whether a calculation is to be skipped by the next pipeline stage.

4. A logic circuit having a pipelined structure, comprising:

a first stage pipeline combinational circuit having a plurality of sections divided at bit positions of data to be calculated, arithmetic results with and without a carry input are generated at each section, and a carry-select addition is performed for selecting the arithmetic results in accordance with a carry signal from a lower section;

a high-speed arithmetic results generator having a plurality of selectors respectively provided for the plurality of sections, said selectors inputting the arithmetic results with and without the carry input generated at each respective section and selecting the arithmetic results in accordance with the lower section carry signal, the arithmetic results selected by said selectors are output as intermediate arithmetic results, thereby making it possible to skip calculation of total carry propagation and to provide the intermediate arithmetic results as valid results to a next stage pipeline combination circuit.

5. The logic circuit of claim 4, further comprising:

a plurality of flip-flops connected to the sections and selectors;

a decision circuit for outputting a decision signal;

a long carry generator and final add/subtract results generator connected to the flip-flops for calculating the total carry propagation to select proper arithmetic results and to output final arithmetic results; and an output selector for selecting, based on the decision signal, one of the intermediate arithmetic results and the final arithmetic results to determine the valid arithmetic results, and for outputting the valid arithmetic results to a second stage combination circuit.

6. A logic circuit for performing a restoring-division, comprising:

a first holding circuit configured to hold at least a dividend;

a first subtractor configured to input the dividend held by said first holding circuit and to input a divisor, said first subtractor executing subtraction of the input data;

a first selector configured to select the subtraction results by the first subtractor and the divisor, and to execute and output the input data in accordance with a first selection signal;

a second subtractor configured to input an output of said first selector and the divisor, and to execute subtraction of the input data, the second subtractor having a first critical path and having a first peak position of use probability as to path length;

a second selector configured to input outputs of the second subtractor and the first selector, and to select and output the input data in accordance with a second selection signal;

a third selector configured to input at least an output of the second selector and the dividend, and to select the input data in accordance with a third selection signal and to output the selected input data to said first holding circuit;

a second holding circuit configured to hold an output of the first holding circuit;

a third subtractor configured to input an output of the first selector held by the second holding circuit and the divisor, and to execute subtraction of the input data, the third subtractor having a second critical path shorter than the first critical path, and having a second peak position longer than the first peak position of use probability;

a fourth selector configured to input outputs of the third subtractor and the second holding circuit, and to select and output the input data in accordance with a fourth selection signal;

a third holding circuit configured to hold output data of the fourth selector;

a fifth selector configured to input data held by the third holding circuit and data output from the second selector, to select the input data in accordance with a fifth selection signal, and to output the selected data to the third selector; and a comparator configured to input data held by the third holding circuit and data held by the first holding circuit, to execute comparison between the input data, and to output the fifth selection signal, wherein a first combination that includes the first and second subtractors but not the third subtractor, and a second combination that includes the first and third subtractors but not the second subtractor, execute respectively a same arithmetic operation with same input data, and wherein the first combination is assigned to have an execution time of one cycle time, and the second combination is assigned to have an execution time of one and one-half cycle time.

7. The logic circuit of claim 6, wherein said second subtractor is a subtractor with a ripple-carry adder, and said third subtractor is a subtractor with a carry-save adder.

8. The logic circuit of claim 2, wherein the ripple-carry adder includes m one-bit adders connected in cascade so as to relay a carry for addition of a predetermined number of bits, wherein m is an integer greater than one and the predetermined number of bits equals m, and wherein the carry-save adder includes m one-bit adders connected in cascade so as to perform calculations for both with a carry and without a carry.

9. The logic circuit of claim 1, wherein a first subset of bits output from the first holding means comprise the first selection signal, and wherein a second subset of bits output from the first holding means comprise the second selection signal.

10. The logic circuit of claim 1, wherein the first and third holding means are clocked by a first clock signal, and wherein the second holding means is clocked by a second clock signal 180 degrees opposite in phase to the first clock signal.

11. The logic circuit of claim 7, wherein the ripple-carry adder includes m one-bit adders connected in cascade so as to relay a carry for addition of a predetermined number of bits, wherein m is an integer greater than one and the predetermined number of bits equals m, and wherein the carry-save adder includes m one-bit adders connected in cascade so as to perform calculations for both with a carry and without a carry.

12. The logic circuit of claim 6, wherein a first subset of bits output from the first holding circuit comprise the first selection signal, and wherein a second subset of bits output from the first holding circuit comprise the second selection signal.

13. The logic circuit of claim 6, wherein the first and third holding circuits are clocked by a first clock signal, and wherein the second holding circuit is clocked by a second clock signal opposite in phase to the first clock signal.

14. The logic circuit of claim 5, wherein the decision circuit comprises:

a first stage that includes a plurality of AND gates and inverters; and a second stage that includes an OR gate, wherein the decision circuit outputs the decision signal in a first logical state when the intermediate arithmetic results totally agree with the final arithmetic results, and wherein the decision circuit outputs the decision signal in a second logical state when the intermediate arithmetic results do not totally agree with the final arithmetic results.

* * * * *